US008994117B2

(12) United States Patent
Ficke et al.

(10) Patent No.: US 8,994,117 B2
(45) Date of Patent: Mar. 31, 2015

(54) MOAT CONSTRUCTION TO REDUCE NOISE COUPLING TO A QUIET SUPPLY

(71) Applicant: International Business Machines Corporation, Armonk, NY (US)

(72) Inventors: Joel T. Ficke, Bloomer, WI (US); David M. Friend, Rochester, MN (US); James D. Strom, Rochester, MN (US); Erik S. Unterborn, Oronco, MN (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 13/718,019

(22) Filed: Dec. 18, 2012

(65) Prior Publication Data

US 2014/0167213 A1 Jun. 19, 2014

(51) Int. Cl.

| | |
|---|---|
| ***H01L 29/15*** | (2006.01) |
| ***H01L 31/0312*** | (2006.01) |
| ***H01L 27/11*** | (2006.01) |
| ***H01L 29/02*** | (2006.01) |
| ***H01L 21/8238*** | (2006.01) |
| ***H01L 21/76*** | (2006.01) |
| ***H01L 29/06*** | (2006.01) |
| ***H01L 21/761*** | (2006.01) |
| ***H01L 21/762*** | (2006.01) |

(52) U.S. Cl.
CPC .......... *H01L 29/0649* (2013.01); *H01L 21/761* (2013.01); *H01L 21/762* (2013.01)
USPC ............. 257/379; 257/402; 257/77; 438/231; 438/232; 438/400

(58) Field of Classification Search
None
See application file for complete search history.

(56) References Cited

U.S. PATENT DOCUMENTS

| | | | | |
|---|---|---|---|---|
| 5,141,890 A * | 8/1992 | Haken | .......................... | 438/231 |
| 5,338,969 A * | 8/1994 | Kaya | .......................... | 257/659 |
| 5,382,825 A | 1/1995 | Neilson | | |
| 6,191,458 B1 * | 2/2001 | Brown et al. | ................ | 257/379 |
| 6,287,931 B1 | 9/2001 | Chen | | |
| 6,445,055 B2 | 9/2002 | Iwasakii et al. | | |
| 6,630,623 B1 | 10/2003 | Whitney et al. | | |

(Continued)

FOREIGN PATENT DOCUMENTS

| | | |
|---|---|---|
| CN | 102683262 A | 9/2012 |
| JP | 2008227113 A | 9/2008 |

OTHER PUBLICATIONS

Dai, Haitao et al., "Modeling and Experimental Measurement of Active Substrate-Noise Suppression in Mixed-Signal 0.18-um BiCMOS Technology", IEEE Transactions on Computer-Aided Design of Integrated Circuits and Systems, vol. 28, No. 6, Jun. 2009, pp. 826-836.

(Continued)

*Primary Examiner* — Steven Loke
*Assistant Examiner* — Juanita B Rhodes
(74) *Attorney, Agent, or Firm* — Robert R. Williams

(57) ABSTRACT

A semiconductor chip having a P− substrate and an N+ epitaxial layer grown on the P− substrate is shown. A P− circuit layer is grown on top of the N+ epitaxial layer. A first moat having an electrically quiet ground connected to a first N+ epitaxial region is created by isolating the first N+ epitaxial region with a first deep trench. The first moat is surrounded, except for a DC path, by a second moat with a second N+ epitaxial region, created by isolating the second N+ epitaxial region with a second deep trench. The second moat may be arranged as a rectangular spiral around the first moat.

6 Claims, 4 Drawing Sheets

(56) References Cited

U.S. PATENT DOCUMENTS

| | | | |
|---|---|---|---|
| 6,826,025 | B2 | 11/2004 | Singh et al. |
| 7,196,397 | B2 | 3/2007 | Chiola et al. |
| 2007/0290226 | A1 | 12/2007 | Berntgen et al. |
| 2009/0032906 | A1 | 2/2009 | Ostermann et al. |
| 2009/0181506 | A1* | 7/2009 | Chen et al. .................... 438/232 |
| 2010/0302854 | A1 | 12/2010 | Wu et al. |
| 2011/0193193 | A1 | 8/2011 | Dube et al. |
| 2012/0286392 | A1 | 11/2012 | Pei et al. |

OTHER PUBLICATIONS

Wane, Sidina et al., "Full-Wave Analysis of Inhomogeneous Deep-Trench Isolation Patterning for Substrate Coupling Reduction and Q-Factor Improvement", IEEE Transactions on Microwave Theory and Techniques, vol. 54, No. 12, Dec. 2006, pp. 4397-4411.

International Search Report and Written Opinion of the ISA dated Mar. 20, 2014—International Application No. PCT/US2013/075681.

* cited by examiner

MOAT CONSTRUCTION TO REDUCE NOISE COUPLING TO A QUIET SUPPLY

FIELD OF THE INVENTION

This invention relates generally to providing a reduced noise coupling to a quiet (noise free) supply on a semiconductor chip.

SUMMARY OF EMBODIMENTS OF THE INVENTION

Electronic systems, such as computers, electronic gaming systems, and the like typically include semiconductor chips which contain digital circuitry. Often the digital circuitry is switched rapidly, causing large current transients and resulting electrical noise such as voltage variation on a supply voltage on the semiconductor chips. Circuits that are sensitive to electrical noise may perform poorly when subjected to variation on the supply voltage.

In an embodiment of the invention, a moat isolation structure is created on a semiconductor chip having a P− substrate. An N+ epitaxial layer is grown on the P− substrate. A first moat comprises a first N+ epitaxial region electrically isolated from a second N+ epitaxial region by a first deep trench surrounding a perimeter of the first moat. The first N+ epitaxial region is connected to a first supply voltage, such as an analog ground supply voltage that must be kept as noise free as possible. A second moat comprises a third N+ epitaxial region isolated from the second N+ epitaxial region by a second deep trench surrounding a perimeter of the second moat, the second moat surrounding the first moat except for a DC path in the second N+ epitaxial region extending from the first deep trench to an area outside of the second moat.

In an embodiment, the second moat may be formed in a spiral rectangular ring around the first moat. In an embodiment, the isolation moat structure may be created as a series of rectangular rings around the first moat, with gaps to provide a DC path extending from the first deep trench to an area outside of the second moat.

DETAILED DESCRIPTION OF THE EMBODIMENTS

Electronic systems, such as computers, electronic gaming systems, and the like typically include semiconductor chips which have digital circuitry. Often the digital circuitry is switched rapidly, causing large current transients and resulting electrical noise such as voltage variation on supply voltage on the chips. Circuits that are sensitive to electrical noise may perform poorly when subjected to variations on supply voltages. Phase-locked loop circuits are one example of circuits that are sensitive to electrical noise.

Creation of a region (or regions) on a chip to isolate noise sensitive circuitry is taught in embodiments of the present invention.

A particular semiconductor chip has a P− substrate, an N+ epitaxial layer above the P− substrate, and circuit regions above the N+ epitaxial layer. The circuit region may comprise P− regions and recessed oxide regions. An NBMOAT is a structure having an N+ epi layer above which is a "circuit layer" that may have patterned source/drain regions in a P− layer. Recessed oxide is used to isolate the patterned source/drain regions in the P− layer. A deep trench completely surrounds and electrically isolates an N+ epi region within the NBMOAT. An NBMOAT herein is also called, simply, "moat".

NBMOATs may be created using deep trench DTMOAT structures; however layout ground rules may not allow creation of NBMOATs within NBMOATs, thereby preventing creation of concentric NBMOAT structures that would serve to reduce electrical noise in an inner NBMOAT in the concentric NBMOAT structure.

Taught herein is a first NBMOAT within which circuits sensitive to electrical noise are placed. A spiral second NBMOAT, the spiral open at a distal end from the first NBMOAT, is created around the first NBMOAT to create isolation similar to a concentric NBMOAT structure, but which provides a DC path from the DTMOAT surrounding the first NBMOAT to an area outside the second NBMOAT so that the NBMOAT structure can be checked with existing ground rule checking tools which may not support an "NBMOAT inside another NBMOAT".

Figure 1:
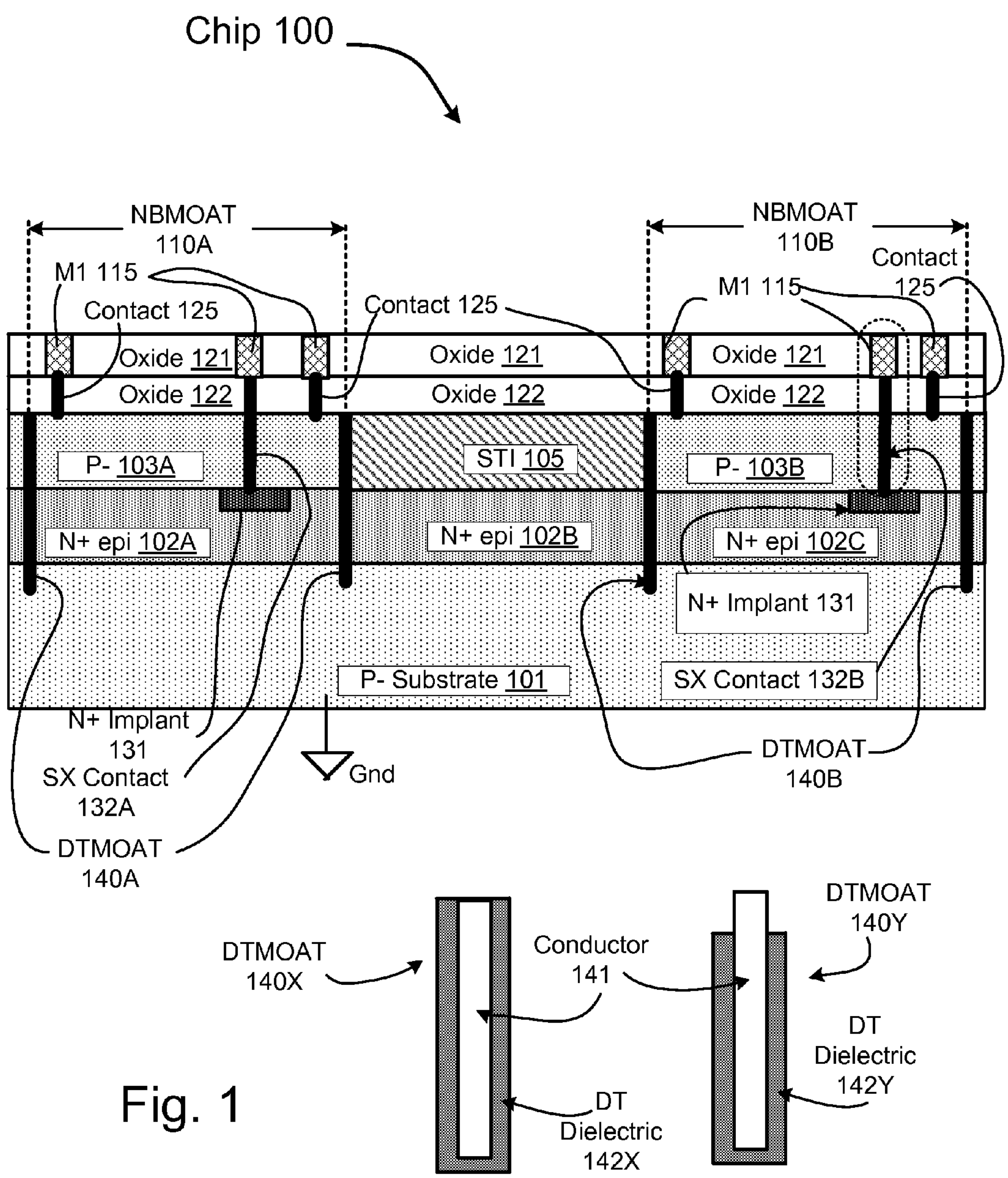
FIG. 1 shows a cross sectional view of a semiconductor chip with moats created by deep trench isolations.

Referring now to FIG. 1, a chip 100 is shown to comprise a P− substrate 101. An N+ epi (epitaxial layer) 102 (portions shown as N+ epi 102A, 102B, 102C) is formed on top of P− substrate 101. A P− epi layer 103 (portions shown as P− epi layer 103A, 103B) is formed on top of N+ epi 102 (It is understood that N+ epi 102 and P− 103 are grown over the entire semiconductor chip. Portions of N+ epi 102 (102A, 102B, 102C) are isolated one from another with deep trench isolation (DTMOAT) structures 140. Similar isolation by DTMOAT 140 structures for isolating P− 103 areas). It is also understood that SX contacts 132 puncture (or pierce) P− 103 but do not isolate regions of P− 103. STI (shallow trench isolation) 105 areas are formed using ROX (Recessed Oxide) masks to provide isolation where desired by the designer. Oxide layers 122 and 121 may be placed above the P− 103 layer. It will be understood that Oxide layers 122 and/or 121 may include additional insulating materials besides oxide materials. Oxide 121 layer is a layer where M1 (metal 1) 115 is formed and insulated electrically by oxide such as SiO2.

P− 103A and N+ epi 102A are denoted with the "A" for easy reference to those particular P− 103 and N+ epi 102 regions. P− 103A and N+ epi 102A are electrically isolated from other P− 103 and N+ epi 102 regions by DTMOAT 140A which completely surrounds P− 103A and N+ epi 102A. Likewise N+ epi 102C and P− 103B are electrically isolated by being completely surrounded by a DTMOAT 140B. Generically, a DTMOAT is referred to as DTMOAT 140, with letters appended to refer to a particular DTMOAT 140.

An N+ implant 131 is formed in N+ epi 102, using a mask and implant after formation of N+ epi 102 (N+ epi 102 shown as N+ epi 102A, 102B, 102C but is generically referred to as N+ epi 102). A contact (SX contact 132) is formed through P− 103 and oxide 122 to electrically connect a particular N+ epi 102 with a particular M1 (metal 1) 115 that is created in Oxide 121 layer. N+ epi 102 may be required by electrical ground rules to be connected to a Gnd supply (e.g., logic Gnd, or a quiet Gnd created in embodiments of the invention). Exemplary SX contacts 132 (132A, 132B) are shown in FIG. 1. See FIGS. 1, 2, and 3 for SX contact 132A in NBMOAT 110A, SX contact 132B to contact N+ epi 102B (FIG. 1), SX contact 132B shown in FIGS. 2 and 3. SX contact 132B is used to contact N+ epi 102C of NBMOAT 110B. SX contacts 132D, 132E, 132F are used to contact N+ epi in NBMOATs 110C, 110D, 110E in FIG. 3 to a ground supply.

P− 103 is coupled to a Gnd supply using a particular M1 115 connected to a Gnd supply voltage and a contact 125 as shown. There may be more than one "Gnd" supply on chip 100, for example a logic ground that may be electrically noisy due to switching transients of logic circuitry, and an analog Gnd (AGND) that needs to be kept relatively noise-free (electrically quiet) and isolated from logic Gnd. A P+ implant may be used to improve connection of P− 103 to contact 125.

NBMOAT 110 (two shown, NBMOATs 110A, 110B; NBMOAT 110 used to generically refer to an NBMOAT) are areas completely surrounded by a DTMOAT 140 (DTMOATs 140 are deep trench structures that isolate a first region of N+ epi 102 from a second region of N+ epi 102. For example, N+ epi 102A, N+ epi 102B, and N+ epi 102C are electrically isolated in FIG. 1 by DTMOAT 140 deep trench structures. P− 103 regions in an NBMOAT 110 are also isolated by DTMOATs 140 from P− 103 regions outside the NBMOAT 110). A number of DTMOATs 140 are referenced in FIG. 2.

DTMOAT 140, in embodiments, may, for ground rule requirements, have to be electrically connected to a supply voltage. A first embodiment of DTMOAT 140, shown as 140X, has DT dielectric 142X cover the entire side portions of conductor 141 and no electrical connection is made to conductor 141 in DTMOAT 140X. However, in DTMOAT 140Y, DT dielectric 142Y has been etched away or otherwise not formed, near a top of conductor 141. An electrical connection may be made to a supply voltage (e.g., Vdd) by forming an N+ region in P− 103 prior to etching DTMOAT 140B and connecting the N+ region to Vdd using a contact such as contact 125. The Vdd to connected N+ region will thereby be coupled to conductor 141 in DTMOAT 140Y. DTMOAT 140 is used to generically refer to a DTMOAT; as with NBMOAT 110, letters may be appended to denote a particular DTMOAT 140.

Areas between a first NBMOAT 110 and a second NBMOAT 110 (shown as 110A, 110B) may have STI (shallow trench isolation) 105 or P− 103 areas according to masks produced by the designer. For example, a RX (recessed oxide) mask may define areas that are P− 103 and which areas are STI 105.

Figure 2:
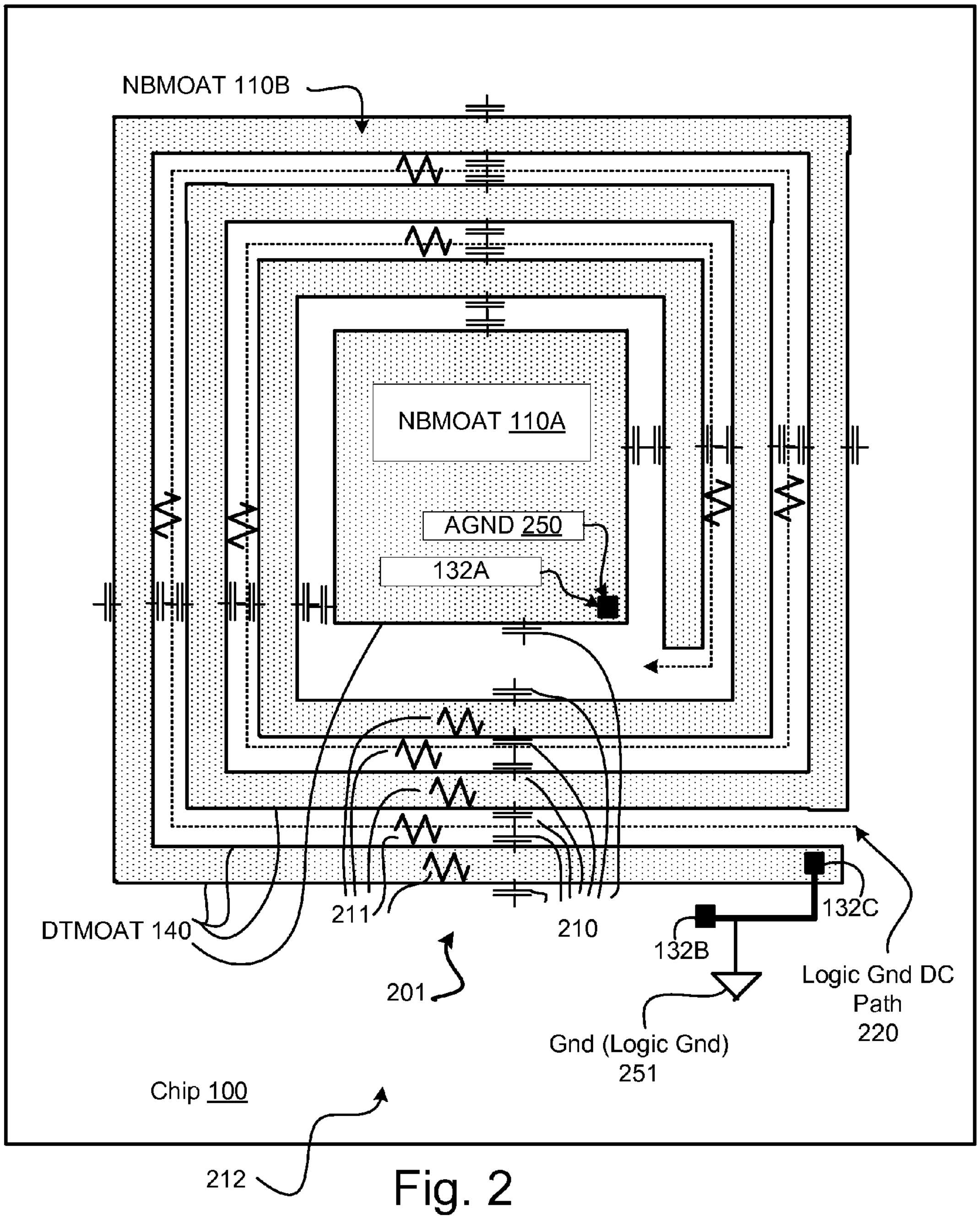
FIG. 2 shows a top view of the semiconductor chip showing a first moat within a spiraled second moat as an embodiment of isolation of the first moat.

With reference now to FIGS. 1 and 2, an NBMOAT isolation structure 201 comprising NBMOAT 110B designed as a spiral around NBMOAT 110A. DTMOATs 140 (140A, 140B) electrically isolate N+ epi 102 and P− 103 regions as explained with reference to FIG. 1 earlier. NBMOAT 110A has N+ epi 102 epi region (102A, FIG. 1) connected to analog ground (AGND) 250 using an M1 115 connected to AGND, with SX contact 132A transferring the AGND voltage to the N+ Implant 131 in NBMOAT 110A. AGND 250 may be brought onto semiconductor chip 100 using one or more designated pins on semiconductor chip 100.

SX contact 132B connects Gnd to areas on semiconductor chip 100 that are not in an NBMOAT isolation structure 201. SX contact 132C connects Gnd to NBMOAT 110B, preferably near a portion of NBMOAT 110B at or near an end of NBMOAT 110B distal from NBMOAT 110A.

Consider now the electrical isolation provided by NBMOAT 110B for the N+ epi 102A of NBMOAT 110A. Gnd (logic Gnd) 251 may be expected to be noisy due to switching transients of logic circuitry (latches, combinatorial logic, clock buffers, SRAMs (static random access memory)). Gnd 251 is connected to N+ epi 102C of NBMOAT 110B as shown, using SX contact 132C. N+ epi 102 has a significant resistivity, for example, 15 ohms/square in an exemplary technology. The spiral structure of NBMOAT 110B provides a relatively long, narrow, N+ epi 102C, and series resistance may be on the order of 100 Kohms for an N+ epi 102C having approximately 6000 squares in length. This example of resistivity, width, and length is for exemplary purposes and other values for width, length, and resistivity are contemplated.

Resistors 211 in NBMOAT 110B represent the distributed resistance of N+ epi 102C in NBMOAT 110B. This relatively high resistance will attenuate noise on Gnd 251 coupled into SX contact 132C. Likewise, N+ epi 102B (FIG. 1) between spiral portions of NBMOAT 110B have similar resistance, also represented by resistors 211 (which may or may not be equal resistance to resistors 211 in NBMOAT 110B, depending on relative widths of the spiral portions of NBMOAT 110B and the width of spacing between the spiral portions of NBMOAT 110B, as will be appreciated by those of skill in the art. In an embodiment of the invention, NBMOAT 110B is as narrow as layout ground rules permit, in order to maximize series resistance of the N+ epi 102C from a distal to a proximal end, relative to NBMOAT 110A, of NBMOAT 110B. Likewise, in an embodiment, separation of spiral arms of NBMOAT 110B are also designed to be as narrow as layout ground rules permit in order to maximize series resistance of DC path 220 through N+ epi 110B (see FIG. 1).

Capacitive coupling from noise on N+ epi 102 in region 212 to N+ epi 102A in NBMOAT 110A may be reduced due to the spiral structure of NBMOAT 110B causing capacitances to be series connected. Series capacitors 210 are shown (for simplicity, only series capacitors 210 on bottom portions of the spiral are referenced). Capacitors 210 are capacitances from a first side of a DTMOAT 140 to a second side of DTMOAT 140. Each capacitor 210 comprises a first capacitance from a first N+ epi 102 to a conductor 141 in the DTMOAT 140 in series with a second capacitance from the conductor 141 in the DTMOAT 140 to a second N+ epi 102. DT dielectric 142 (142X, 142Y shown in variants of DTMOATs 140 (140X, 140Y) in FIG. 1) is a dielectric of the two series capacitors in each capacitor 210. Each capacitor 210 is effectively coupled in series as shown in FIG. 2. In the example of FIG. 2, effective capacitance from N+ epi 102 in area 212 to N+ epi 102A in NBMOAT 110A is $$C_{effective}=4*C210/7$$

The "4" is for four sides; C210 is capacitance of a capacitor 210; and there are seven series capacitors (recall also that each capacitor 210 is already two series connected capacitors as described above). Area 212 is an area on chip 100 in which relatively noise insensitive logic circuitry is placed. NBMOAT 110A is reserved for circuitry that is more sensitive to noise. Circuitry in NBMOAT 110A may be digital logic or analog circuitry. The equation above is of course a greatly simplified approximation, as the spiral arms of NBMOAT 110B decrease in length at each more inner arm portion of the spiral. Furthermore, there exists additional capacitance (junction capacitance) between each N+ epi 102B, N+ epi 102C and P− substrate 101.

NBMOAT 110B is "spiraled" around NBMOAT 110A, yet has an "opening" extending from the DTMOAT 140A all the way between the spirals of NBMOAT 110B (logic Gnd DC path 220, FIG. 2) therefore, the layout ground rules may be checked.

Figure 3:
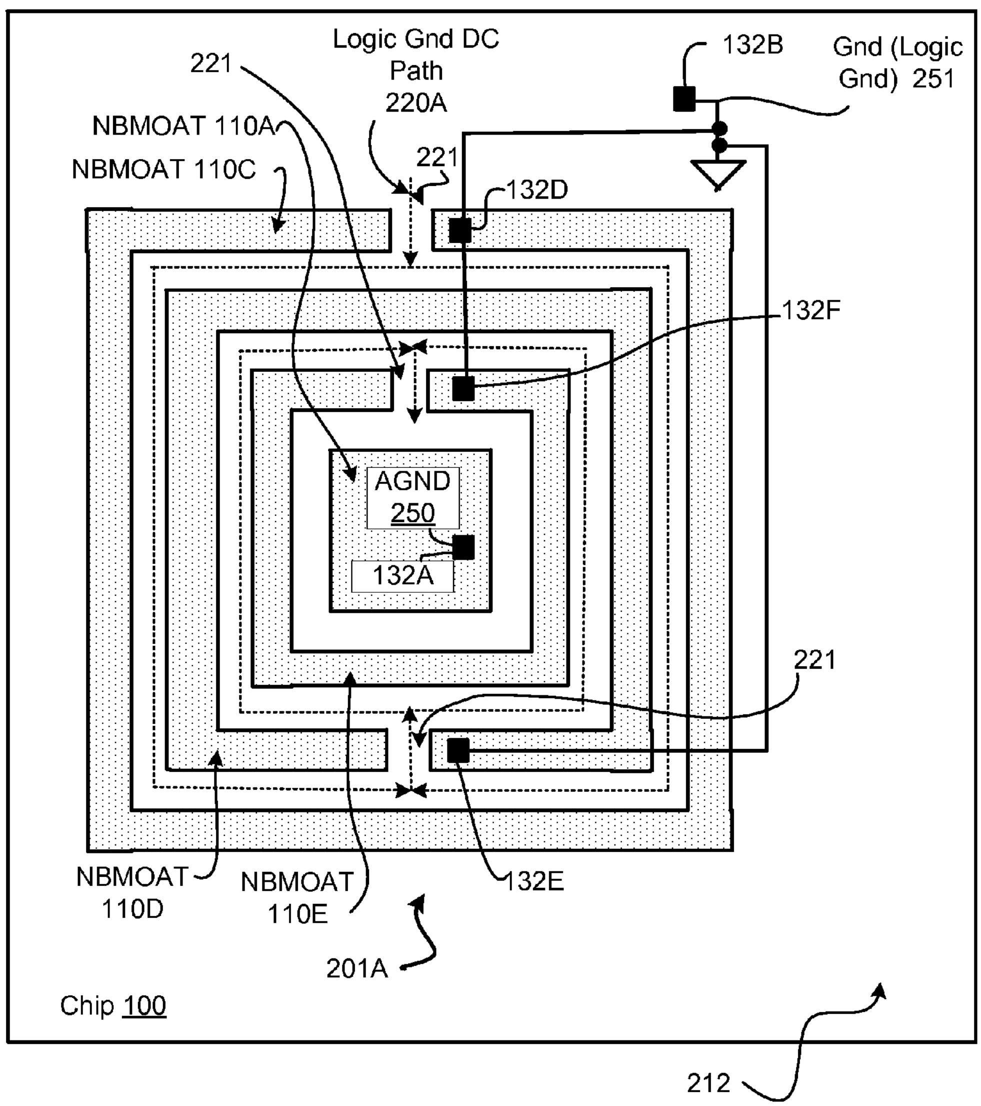
FIG. 3 shows an alternate embodiment of the semiconductor chip showing the first moat isolated by concentric rectangular partial rings of moats, each of the concentric rectangular rings having a gap.

Alternate embodiments of NBMOAT isolation structure 201 are contemplated. For example, FIG. 3 shows a chip 100 having NBMOAT isolation structure 201A, which includes many of the advantages of NBMOAT isolation structure 201. Particular referenced structures may be as referenced in FIGS. 1 and 2.

NBMOAT isolation structure 201 A comprises NBMOAT 110A, which may be identical to NBMOAT 110A of FIG. 2. However, instead of a spiraled NBMOAT 110B as was shown in FIG. 2, a number of concentric NBMOAT rectangular "rings", with gaps 221 in the rings is shown in NBMOAT isolation structure 201A. An outer NBMOAT 110C ring has a gap 221 through which logic ground DC path 220 passes in the N+ epi 102B (FIG. 1). The gaps 221 may provide layout ground rule checking capability. NBMOAT 110D is an NBMOAT rectangular ring, also with a gap 221 for DC path 220A. NBMOAT 110E is yet another NBMOAT concentric rectangular ring, also having a gap 221. For a given chip area, NBMOAT isolation structure 201A has almost as much capacitive attenuation (i.e., series capacitances) as NBMOAT isolation structure 201, but may have a lower value series resistive path 220A from region 212 to NBMOAT 110A. Likewise, since N+ epi 102 regions may be connected to Gnd, connection of logic Gnd 251 to SX contacts 132D, 132E and 132F will tend to bring the relatively noisy Gnd 251 further inside NBMOAT isolation structure 201A than Gnd 251 is brought into NBMOAT isolation structure 201.

In NBMOAT isolation structure 201A of FIG. 3, it will be noted that SX contacts 132D, 132E, and 132F are near the respective gaps 221 of NBMOATs 110C, 110D, and 110E to provide as much series resistance as possible along the distributed resistance (see resistors 211, FIG. 2, which represent distributed resistance of NBMOAT 110B in FIG. 2) of the N+ epi regions of NBMOATs 110C, 110D, and 110E. Preferably, SX contacts 132D, 132E, and 132F are as formed as close to the gap ends of NBMOATs 110C, 110D, 110E as layout ground rules allow, but further distances are contemplated.

In the NBMOAT isolation structure 201A of FIG. 3 it will also be noted that the gaps 221 of the concentric rectangular rings alternate from one side to an opposite side of NBMOAT 110A to provide as high a resistance as possible for DC path 220. Other positioning of the gaps 221 is contemplated, but such positioning would have a lower resistance DC path 220 through the second N+ epitaxial region.

The above spiral and rectangular ring embodiments are merely examples of NBMOAT isolation structures 201. It is contemplated that NBMOAT 110A may be of irregular shape, e.g., not a rectangle, or perhaps comprising first and second rectangular portions. The surrounding NBMOAT structure may not be one or more rectangular rings with gaps or a spiral, but may have irregularly shaped sections.

Figure 4:
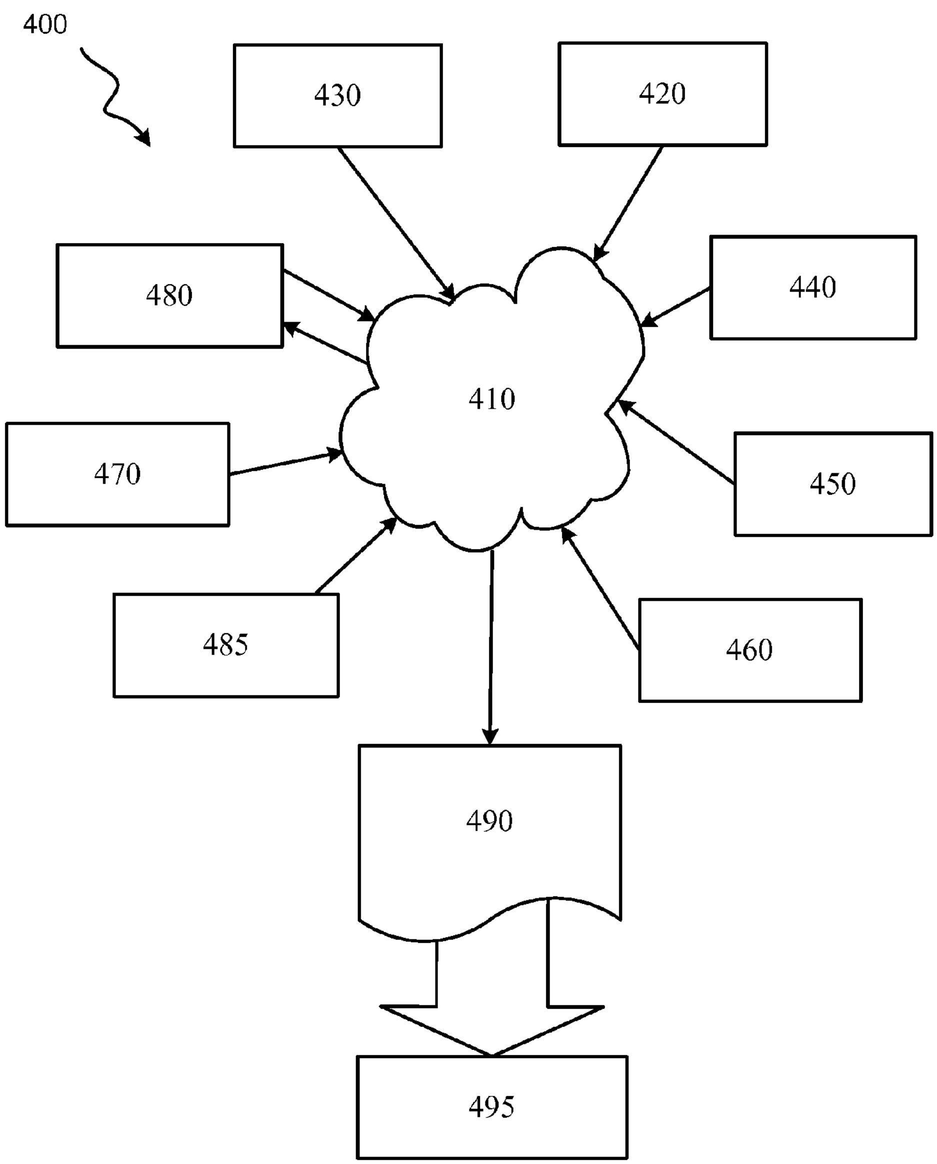
FIG. 4 shows a process to create a design structure containing information that, when used by a suitable semiconductor fabrication process, will create a moat isolation structure.

FIG. 4 illustrates multiple design structures 400 including an input design structure 420 that is preferably processed by a design process. Design structure 420 may be a logical simulation design structure generated and processed by design process 410 to produce a logically equivalent functional representation of a hardware device, such as semiconductor chip 100 (FIG. 1) including NBMOAT isolation structure 201. Design structure 420 may alternatively include data or program instructions that, when processed by design process 410, generate a functional representation of the physical structure of a hardware device. Whether representing functional or structural design features, design structure 420 may be generated using electronic computer-aided design, such as that implemented by a core developer/designer. When encoded on a machine-readable data transmission, gate array, or storage medium, design structure 420 may be accessed and processed by one or more hardware or software modules within design process 410 to simulate or otherwise functionally represent an electronic component, circuit, electronic or logic module, apparatus, device, or system such as those shown in FIGS. 1, 2 and 3. As such, design structure 420 may include files or other data structures including human or machine-readable source code, complied structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 410 preferably employs and incorporates hardware or software modules for synthesizing, translating, or otherwise processing a design/simulation functional equivalent of the components, circuits, devices, or logic structures shown in FIGS. 1, 2, and 3 to generate a Netlist 480 which may contain design structures such as design structure 420. Netlist 480 may comprise, for example, compiled or otherwise processed data structures representing a list of wires, discrete components, logic gates, control circuits, I/O devices, models, etc. that describe the connections to other elements and circuits in an integrated circuit design. Netlist 480 may be synthesized using an iterative process in which Netlist 480 is resynthesized one or more times depending on design specifications and parameters for the device. As with other design structure types described herein, Netlist 480 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 410 may include hardware and software modules for processing a variety of input data structure types including Netlist 480. Such data structure types may reside, for example, within library elements 430 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 440, characterization data 450, verification data 460, design rules 470, and test data files 485 which may include input test patterns, output test results, and other testing information. Design process 410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 410, without deviating from the scope and spirit of the invention. Design process 410 may also include modules for performing standard circuit design processes such as timing analysis, verification, design rule checking, place and route operations, etc.

Design process 410 employs and incorporates logic and physical design tools such as HDL compilers and simulation model build tools to process design structure 420 together with some or all of the depicted supporting data structures, along with any additional mechanical design or data, to generate a second design structure 490. Design structure 490 resides on a storage medium or programmable gate array in a data format used for the exchange of data of mechanical devices and structures (e.g., information stored on an ICES, DXF, Parasolid XT, JT, DRG, or any other suitable format for storing or rendering such mechanical design structures). Similar to design structure 420, design structure 490 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIGS. 1, 2 and 3. In one embodiment, design structure 490 may comprise a compiled, executable HDL simulation model that functionally simulates the devices shown in FIGS. 1, 2, and 3.

Design structure 490 may also employ a data format used for the exchange of layout data of integrated circuits and/or symbolic data format (e.g., information stored in a GDSII, GL1, OASIS, map files, or any other suitable format for storing such design data structures). Design structure 490 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, and 3. Design structure 490 may then proceed to a state 495 where, for example, design structure 490 proceeds to tape-out, is released to manufacturing, is released to a mask house, is sent to another design house, is sent back to the customer, etc.

What is claimed is:

1. A moat isolation structure on a semiconductor chip having a P− substrate and an N+ epitaxial grown layer covering the entire P− substrate, and a circuit layer above the N+ epitaxial grown layer, the moat isolation structure comprising:

the circuit layer having patterned P− regions in which circuits are formed, the circuit layer further comprising shallow trench isolation (STI) areas to isolate the patterned P− regions, a first moat comprising a first N+ epitaxial region in the N+ epitaxial grown layer and a first patterned P− region over the first N+ epitaxial region, the first N+ epitaxial region electrically isolated from a second N+epitaxial region in the N+epitaxial grown layer by a first deep trench that extends through the circuit layer, the N+epitaxial grown layer, and extending into the P- substrate, the first deep trench further comprising a conductor at least partially surrounded by a dielectric, the first deep trench surrounding a perimeter of the first moat, the first N+ epitaxial region connected to a first supply voltage;

a second moat comprising a third N+ epitaxial region in the N+ epitaxial grown layer and a second patterned P− region over the third N+ epitaxial region, the third N+ epitaxial region isolated from the second N+ epitaxial region in the N+epitaxial grown layer by a second deep trench that extends through the circuit layer, the N+ epitaxial grown layer, and extending into the P− substrate, the second deep trench further comprising a conductor at least partially surrounded by a dielectric, the second deep trench surrounding a perimeter of the second moat, the second moat surrounding the first moat except for a DC path in the second N+ epitaxial region extending from the first deep trench to an area outside of the second moat.

2. The moat isolation structure of claim 1, the second moat formed in a spiral around the first moat.

3. The moat isolation structure of claim 2, further comprising a connection between a second voltage supply and the third N+ epitaxial region, the connection closer to an end of the spiral distal to the first moat than an end of the spiral proximal to the first moat.

4. The moat isolation structure of claim 3, the second moat spiral portions being as narrow as layout ground rules permit to maximize series resistance of the third N+ epitaxial region from a first end of the spiral to a second end of the spiral.

5. The moat isolation structure of claim 4, adjacent portions of the spiral being designed to be as close together as layout ground rules permit to maximize series resistance of the second N+ epitaxial region in the DC path.

6. A design structure tangibly embodied in a non-transitory machine-readable storage medium used in a design process of a semiconductor chip, the design structure having elements that, when processed in a semiconductor manufacturing facility, produce a semiconductor chip that comprises:

a P− substrate;

an N+ epitaxial grown layer covering the entire P− substrate;

a circuit layer formed over the N+ epitaxial grown layer, the circuit layer further comprising patterned P− regions in which circuits are formed, the circuit layer further comprising shallow trench isolation (STI) areas to isolate the patterned P− regions, a first moat comprising a first N+ epitaxial region in the N+ epitaxial grown layer and a first patterned P−region over the first N+epitaxial region, the first N+epitaxial region electrically isolated from a second N+epitaxial region in the N+epitaxial grown layer by a first deep trench that extends through the circuit layer, the N+epitaxial grown layer, and extending into the P−substrate, the first deep trench further comprising a conductor at least partially surrounded by a dielectric, the first deep trench surrounding a perimeter of the first moat, the first N+ epitaxial region connected to a first supply voltage;

a second moat comprising a third N+ epitaxial region in the N+ epitaxial grown layer and a second patterned P− region over the third N+ epitaxial region, the third N+ epitaxial region isolated from the second N+ epitaxial region in the N+epitaxial grown layer by a second deep trench that extends through the circuit layer, the N+ epitaxial grown layer, and extending into the P− substrate, the second deep trench further comprising a conductor at least partially surrounded by a dielectric, the second deep trench surrounding a perimeter of the second moat, the second moat surrounding the first moat except for a DC path in the second N+ epitaxial region extending from the first deep trench to an area outside of the second moat.

* * * * *